United States Patent
Pu et al.

(10) Patent No.: US 10,716,219 B2
(45) Date of Patent: Jul. 14, 2020

(54) ELECTRONIC PRODUCT AND MANUFACTURING METHOD THEREOF

(71) Applicants: LITE-ON ELECTRONICS (GUANGZHOU) LIMITED, Guangzhou (CN); LITE-ON TECHNOLOGY CORPORATION, Taipei (TW)

(72) Inventors: Yi-Feng Pu, Taipei (TW); Tzu-Shu Lin, Taipei (TW); Pei-Hsuan Huang, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/869,303

(22) Filed: Jan. 12, 2018

(65) Prior Publication Data

US 2018/0213651 A1   Jul. 26, 2018

(30) Foreign Application Priority Data

Jan. 26, 2017 (CN) .......................... 2017 1 0061653
Jul. 18, 2017 (CN) .......................... 2017 1 0586904

(51) Int. Cl.
*H05K 3/28* (2006.01)
*H05K 3/12* (2006.01)
(Continued)

(52) U.S. Cl.
CPC .......... *H05K 3/1275* (2013.01); *H05K 1/185* (2013.01); *H05K 3/0011* (2013.01);
(Continued)

(58) Field of Classification Search
CPC .. H05K 3/1275; H05K 3/0011; H05K 3/0014; H05K 3/025; H05K 3/32; H05K 1/185
(Continued)

(56) References Cited

U.S. PATENT DOCUMENTS 5,426,568 A   6/1995  Lamers et al.
6,492,911 B1 * 12/2002 Netzer ................. G01D 5/2415
                                                         318/662
(Continued)

FOREIGN PATENT DOCUMENTS

CN   101308953 A   11/2008
CN   101316001 A   12/2008
(Continued)

OTHER PUBLICATIONS

Non-Final Office Action issued in U.S. Appl. No. 15/696,369, filed Sep. 6, 2017, dated Jul. 31, 2018.
(Continued)

*Primary Examiner* — Tremesha S Willis
(74) *Attorney, Agent, or Firm* — McClure, Qualey & Rodack, LLP (57) ABSTRACT

A manufacturing method of an electronic product is provided. The manufacturing method includes following steps. Firstly, a conductive circuit is formed on a film, wherein the conductive circuit is made of a conductive metal layer, the conductive metal layer is a metal foil and the conductive metal layer is patterned to form the conductive circuit. Then, an electronic element is disposed on the conductive circuit of the film, and the electronic element is electrically connected to the conductive circuit. Then, the film and a supporting structure are combined by an out-mold forming technology or an in-mold forming technology, such that the electronic element is wrapped between the film and the supporting structure.

13 Claims, 12 Drawing Sheets

(51) Int. Cl.

| | | |
|---|---|---|
| | *H05K 1/18* | (2006.01) |
| | *H05K 3/32* | (2006.01) |
| | *H05K 3/00* | (2006.01) |
| | *H05K 3/46* | (2006.01) |
| | *H05K 3/02* | (2006.01) |
| | *H05K 3/20* | (2006.01) |
| | *B29C 69/02* | (2006.01) |
| | *B29C 45/14* | (2006.01) |
| | *B29L 31/34* | (2006.01) |
| | *H05K 1/09* | (2006.01) |

(52) U.S. Cl.
CPC ............ *H05K 3/0014* (2013.01); *H05K 3/025* (2013.01); *H05K 3/207* (2013.01); *H05K 3/32* (2013.01); *H05K 3/4644* (2013.01); *B29C 45/14639* (2013.01); *B29C 69/02* (2013.01); *B29L 2031/3425* (2013.01); *H05K 1/095* (2013.01); *H05K 3/28* (2013.01); *H05K 2203/0108* (2013.01); *H05K 2203/0285* (2013.01); *H05K 2203/0522* (2013.01); *H05K 2203/085* (2013.01); *H05K 2203/1105* (2013.01); *H05K 2203/1316* (2013.01); *H05K 2203/178* (2013.01)

(58) Field of Classification Search
USPC ........................................................ 174/260
See application file for complete search history.

(56) References Cited

U.S. PATENT DOCUMENTS

| | | | |
|---|---|---|---|
| 6,514,586 B1* | 2/2003 | Hwang | ................ B32B 7/02 |
| | | | 428/40.1 |
| 2005/0170621 A1* | 8/2005 | Kim | ................ H01L 51/0004 |
| | | | 438/584 |
| 2008/0088459 A1* | 4/2008 | Martin | ............ G06K 19/07749 |
| | | | 340/572.7 |
| 2014/0008678 A1 | 1/2014 | Tien et al. | |
| 2015/0076536 A1 | 3/2015 | Ou et al. | |
| 2015/0221623 A1* | 8/2015 | Tischler | ................ H01L 25/165 |
| | | | 257/89 |
| 2016/0138774 A1 | 5/2016 | Joo et al. | |
| 2016/0276236 A1* | 9/2016 | Bang | ................ H01L 21/4828 |

FOREIGN PATENT DOCUMENTS

| | | |
|---|---|---|
| CN | 103065180 A | 4/2013 |
| CN | 103531699 A | 1/2014 |
| CN | 103899934 A | 7/2014 |
| CN | 104291016 A | 1/2015 |
| CN | 104853541 A | 8/2015 |

OTHER PUBLICATIONS

Office Action dated May 28, 2019 by China National Intellectual Property Administration, pp. 1-10.
CN Office Action dated Mar. 16, 2020 in Chinese application (No. 201710061653.4).

* cited by examiner

ELECTRONIC PRODUCT AND MANUFACTURING METHOD THEREOF

This application claims the benefits of People's Republic of China application Serial No. 201710061653.4, filed Jan. 26, 2017 and People's Republic of China application Serial No. 201710586904.0, filed Jul. 18, 2017, the subject matters of which are incorporated herein by references.

BACKGROUND OF THE INVENTION

Field of the Invention

The invention relates in general to an electronic product and a manufacturing method thereof, and more particularly to a thinned electronic product and a manufacturing method of the thinned electronic product.

Description of the Related Art

In the manufacturing process of a thinned electronic product currently available in the market, normally a conductive ink is printed on a polymer film to form a conductive circuit. However, the conductive ink takes a longer time to dry and therefore boosts the manufacturing cost.

Therefore, how to increase the manufacturing efficiency of the thinned electronic product and reducing the manufacturing cost of the conductive circuit has become a prominent task for the industries.

SUMMARY OF THE INVENTION

The invention is directed to an electronic product and a manufacturing method of the electronic product capable of directly forming a conductive circuit by preferably a hot stamping process or a cold stamping process without using a stencil, hence reducing the manufacturing cost and processing time of the conductive circuit.

According to one embodiment of the invention, a manufacturing method of an electronic product is provided. The manufacturing method includes following steps. Firstly, a conductive circuit is formed on a film, wherein the conductive circuit is made of a conductive metal layer, the conductive metal layer is a metal foil and the conductive metal layer is patterned to form the conductive circuit. An electronic element is disposed on the conductive circuit of the film, wherein the electronic element is electrically connected to the conductive circuit. The film and a supporting structure are combined by an out-mold molding technology or an in-mold molding technology, such that the electronic element is wrapped between the film and the supporting structure.

According to one embodiment of the invention, an electronic product is provided. The electronic product includes a film, a conductive circuit, an electronic element and a support structure. The conductive circuit is formed on the film, and the conductive circuit is made of a conductive metal layer, the conductive metal layer is a metal foil and the conductive metal layer is patterned to form the conductive circuit. The electronic element is displaced on the conductive circuit of the film, and the electronic element is electrically connected to the conductive circuit. The film and the supporting structure are combined by an out-mold molding technology or an in-mold molding technology, such that the electronic element is wrapped between the film and the supporting structure.

According to one embodiment of the invention, an electronic product is provided. The electronic product includes a film, a patterned layer, a conductive circuit, an electronic element and a support structure. The patterned layer is disposed on the film and the conductive circuit is formed on the patterned layer, and the conductive circuit is made of a conductive metal layer, the conductive metal layer is a metal foil and the conductive metal layer is disposed on the patterned layer to be patterned to form the conductive circuit. The electronic element is displaced on the conductive circuit of the film, and the electronic element is electrically connected to the conductive circuit. The film and the supporting structure are combined by an out-mold molding technology or an in-mold molding technology, such that the electronic element is wrapped between the film and the supporting structure.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of the invention are disclosed below with a number of embodiments. However, the disclosed embodiments are for explanatory and exemplary purposes only, not for limiting the scope of protection of the invention. Similar/identical designations are used to indicate similar/identical elements.

Figure 1A:
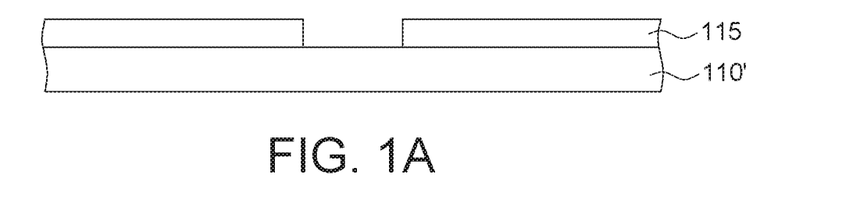
FIGS. 1A-1D are schematic diagrams of forming a conductive circuit by a hot stamping process according to a first embodiment of the present invention.

Refer to FIGS. 1A-1D. The method of forming a conductive circuit 114' by a hot stamping process according to a first embodiment of the present invention includes following steps. Firstly, as indicated in FIG. 1A, a patterned hot melt ink layer 115 is formed on a polymer film 110' by a printing process using a laser printer. The patterned hot melt ink layer 115 can be formed of a toner having an organic binder, and the toner may include 20-30% of ceramic powder (such as F—Fe$_3$O$_4$ crystal powder), 50-60% of polymer resin, 10-20% of charge modifier, fluidizer or surface modifier. The patterned hot melt ink layer 115 has a circuit pattern. After the patterned hot melt ink layer 115 is heated, an adhesion effect will be generated for bonding the patterned hot melt ink layer 115 on the conductive circuit 114' in a hot pressing process.

Figure 1B:
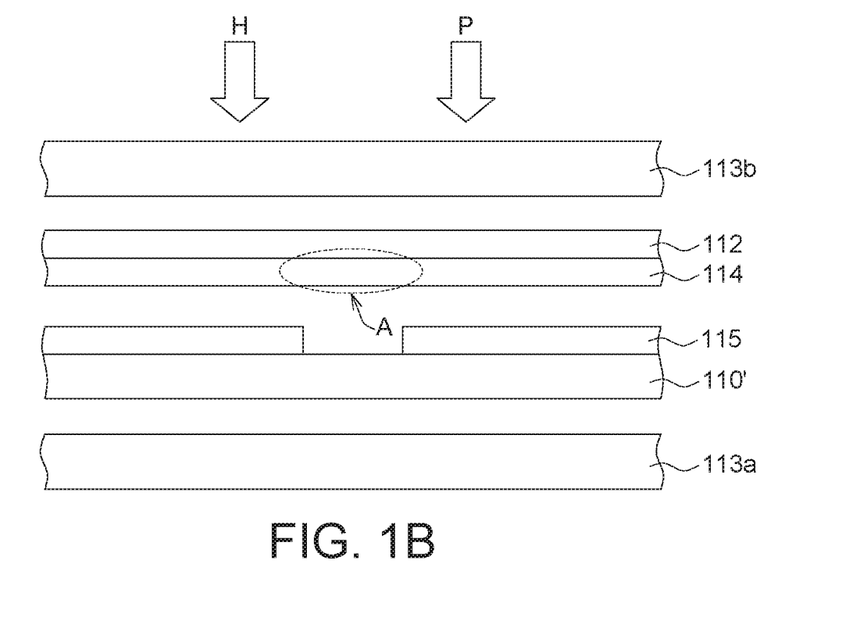

Then, as indicated in FIG. 1B, stamping plates 113a and 113b are formed of a metal (such as zinc or copper), and before a stamping process is performed, the stamping plate 113b is firstly heated by a heater, and then the conductive metal layer 114 having a releasing layer 112, preferably a heat resistant releasing layer, is placed on the patterned hot melt ink layer 115, wherein the conductive metal layer 114 is a metal foil, and the heat resistant releasing layer 112 can be selectively disposed on the conductive metal layer 114, that is, the conductive metal layer 114 having the heat resistant releasing layer 112 or the conductive metal layer 114 without the heat resistant releasing layer 112 is placed on the patterned hot melt ink layer 115 (the conductive metal layer without the heat or light resistant releasing layer of all embodiments in the invention is not illustrated in drawings of the invention), and the stamping plate 113a may be optionally heated by a heater. A heated stamping plate 113a can benefit a uniform distribution of the heat, and a non-heated stamping plate 113a can be used for a positioning purpose and for applying a pressure.

Then, a heat H and a pressure P are applied to the conductive metal layer 114 having the heat resistant releasing layer 112 through the stamping plate 113b for pressing and fixing a part of the conductive metal layer 114 on the patterned hot melt ink layer 115 to form a conductive circuit 114'. Another part of the conductive metal layer 114 not pressed and fixed on the patterned hot melt ink layer 115 (that is, area A) can be removed or taken off by a brush or a scraper (not illustrated) if the conductive metal layer 114 does not have the heat resistant releasing layer 112 disposed thereon or can be removed or taken off using the heat resistant releasing layer 112 attached to the conductive metal layer 114 as indicated in FIG. 1B if the conductive metal layer 114 has the heat resistant releasing layer 112 disposed thereon.

As indicated in FIG. 1B, the heat resistant releasing layer 112 can separate the stamping plate 113b from the conductive metal layer 114 to prevent the conductive metal layer 114 from being damaged by the stamping plate 113b during the hot pressing process. Thus, the conductive metal layer can be protected. The heat resistant releasing layer 112 is preferably formed of silicone, wax, heat resistant resin or other materials having high resistance against the heat and not easily deformed during the hot pressing process. Besides, the heat resistant releasing layer 112 can be formed of a soft material which can be recycled after use to save the material cost.

As indicated in FIG. 1B, the heat resistant releasing layer 112 and the conductive metal layer 114 can be combined by electrostatic absorption, such that the heat resistant releasing layer 112 and the conductive metal layer 114 can still be separated without being fixed to each other. In another embodiment, the heat resistant releasing layer 112 and the conductive metal layer 114 can be combined by a release agent, such that the heat resistant releasing layer 112 and the conductive metal layer 114 can still be separated without being fixed to each other.

Figure 1C:
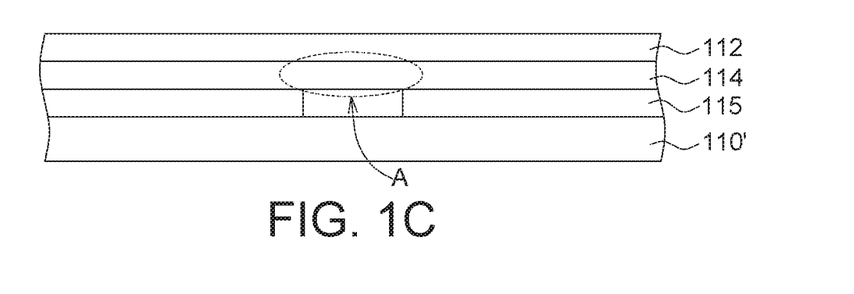

As indicated in FIG. 1C, another part of the conductive metal layer 114 not pressed and fixed (that is, area A) can be removed by peeling off the heat resistant releasing layer 112 along with the another part of the conductive metal layer 114 attached to the heat resistant releasing layer 112 due to a bonding force between the heat resistant releasing layer 112 and the conductive metal layer 114. That is, the part of the conductive metal layer 114 not peeled off is patterned to form a conductive circuit 114' having a circuit pattern.

Figure 1D:
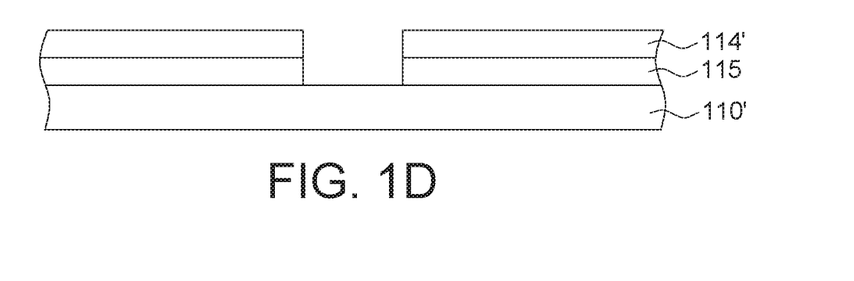

As indicated in FIG. 1D, after the heat resistant releasing layer 112 is peeled off, the conductive metal layer 114' is fixed on the polymer film 110' having the patterned hot melt ink layer 115 to form the conductive circuit 114' having a circuit pattern. It is noted that the conductive circuit 114' of FIG. 1D can be made by other manufacturing methods. For example, in the step as indicated in FIG. 1B, the conductive metal layer 114 can be hot pressed and fixed on the patterned hot melt ink layer 115 by a laminating machine and the other steps can be substantially the same as the hot stamping process.

Figure 2A:
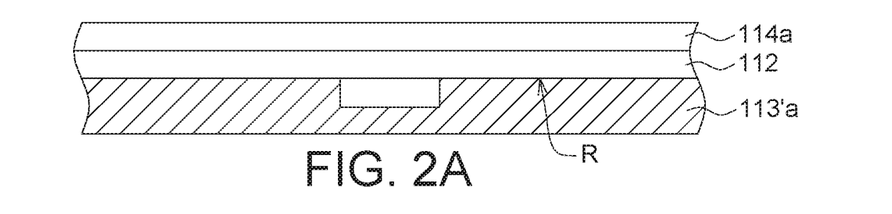
FIGS. 2A-2D are schematic diagrams of forming a conductive circuit by a hot stamping process according to a second embodiment of the present invention.

Refer to FIGS. 2A-2D. The method of forming a conductive circuit 114' by a hot stamping process according to a second embodiment of the present invention includes following steps. Firstly, as indicated in FIG. 2A, a conductive metal layer 114a having a releasing layer 112, preferably a heat resistant releasing layer, is formed, the conductive metal layer 114a is a metal foil, and the heat resistant releasing layer 112 can be selectively disposed under the conductive metal layer 114a, that is, the conductive metal layer 114a having the heat resistant releasing layer 112 or without the heat resistant releasing layer 112, is placed on a toppan stamping plate 113'a. As indicated in FIG. 2A, the heat resistant releasing layer 112 is close to the protrusion R of the toppan stamping plate 113'a, the protrusion R has a circuit pattern, and the conductive metal layer 114a contains a binder providing adhesion to the conductive metal layer 114a.

Figure 2B:
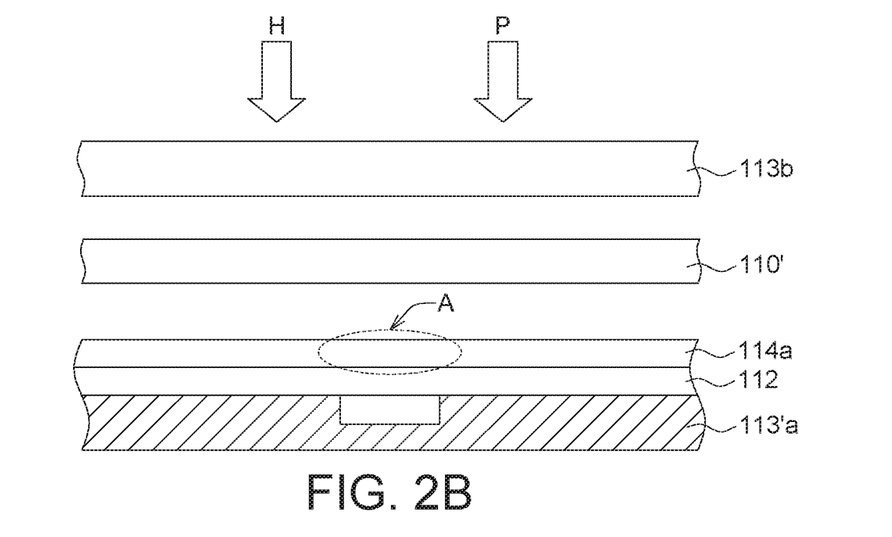
Figure 2C:
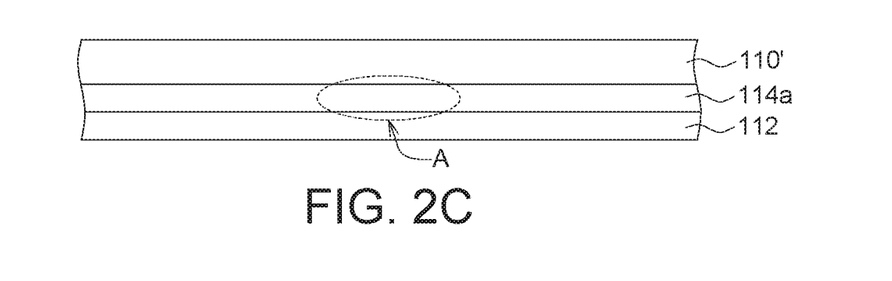
Figure 2D:
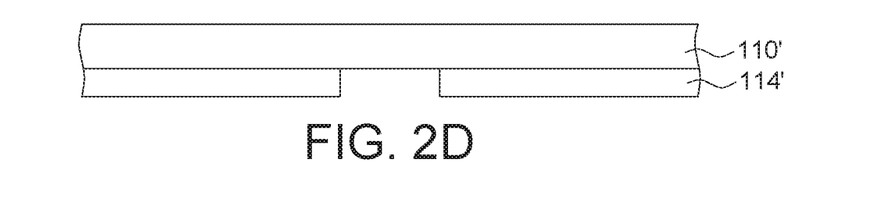

As indicated in FIG. 2B, before a stamping process is performed, the toppan stamping plate 113'a is firstly heated by a heater. The toppan stamping plate 113'a mainly heats and melts the binder of the conductive metal layer 114a and makes the conductive metal layer 114a be bonded on the polymer film 110'. The stamping plate 113b may be heated to benefit a uniform distribution of heat, or may not be heated but be used for a positioning purpose and for applying a pressure. Then, a polymer film 110' is placed on the conductive metal layer 114a, and a heat H and a pressure P are applied to the heat resistant releasing layer 112 and the conductive metal layer 114a through the toppan stamping plate 113'a, such that after a part of the conductive metal layer 114a is heated, the binder thereof is melted and bonded on the polymer film 110'. As indicated in FIG. 2C, the heat resistant releasing layer 112 and another part of the conductive metal layer 114a attached to the heat resistant releasing layer 112 without being pressed and fixed (that is, area A) are peeled off due to a bonding force between the heat resistant releasing layer 112 and the conductive metal layer 114a. As indicated in FIG. 2D, after the heat resistant releasing layer 112 is peeled off, the patterned conductive metal layer 114' is fixed on the polymer film 113' to form a conductive circuit 114' having a circuit pattern. That is, the part of the conductive metal layer 114a not peeled off is patterned to form a conductive circuit 114' having a circuit pattern. It is noted that the conductive circuit 114' of FIG. 2D can be made by other manufacturing methods. For example, in the step as indicated in FIG. 2B, the conductive metal layer 114a can be hot pressed and fixed on the polymer film 110' by a laminating machine and the other steps can be substantially the same as the hot stamping process.

In the present embodiment, the heat resistant releasing layer 112 and the conductive metal layer 114a can be combined by electrostatic absorption or a release agent. Besides, the heat resistant releasing layer 112 can separate the toppan stamping plate 113'a from the conductive metal layer 114a to prevent the conductive metal layer 114a from being damaged by the toppan stamping plate 113'a. Thus, the conductive metal layer 114a can be protected.

Figure 3A:
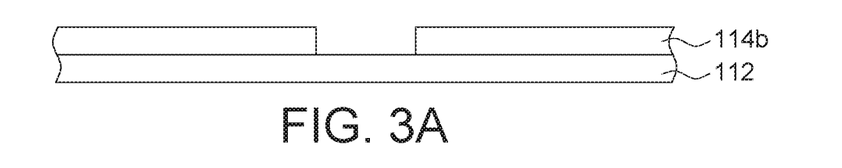
FIGS. 3A-3D are schematic diagrams of forming a conductive circuit by a hot stamping process according to a third embodiment of the present invention.
Figure 3B:
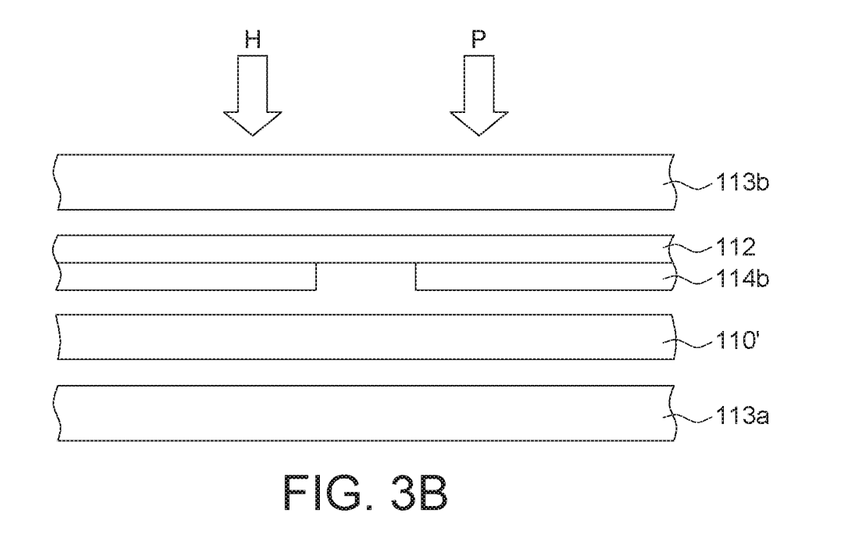
Figure 3C:
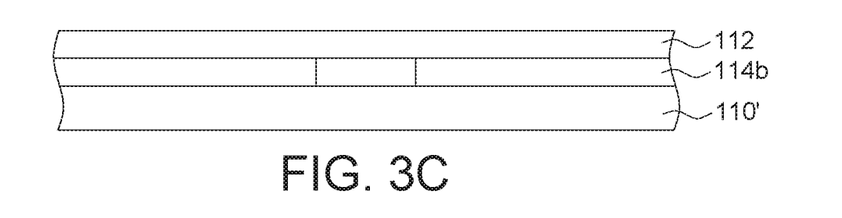
Figure 3D:
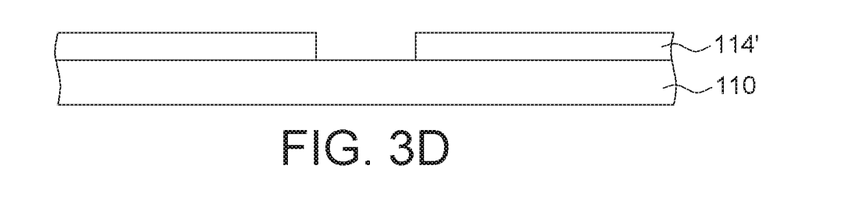

Refer to FIGS. 3A-3D. The method of forming a conductive circuit 114' by a hot stamping process according to a third embodiment of the present invention includes following steps. Firstly, as indicated in FIG. 3A, a conductive metal layer 114b having a circuit pattern is selectively formed on a releasing layer 112, preferably a heat resistant releasing layer, the patterned conductive metal layer 114b is a metal foil, and the conductive metal layer 114b has a binder, which provides adhesion to the conductive metal layer 114b. Then, the conductive metal layer 114b having the circuit pattern along with the heat resistant releasing layer 112 is placed on a polymer film 113' before or after stamping plates 113a and 113b are placed on. As indicated in FIG. 3B, before a stamping process is performed, the stamping plate 113b is firstly heated by a heater. The stamping plate 113a may be heated to benefit a uniform distribution of heat, or the stamping plate 113a may not be heated but be used for a positioning purpose and for applying a pressure. Then, a heat H and a pressure P are applied to the heat resistant releasing layer 112 and the conductive metal layer 114b through the stamping plate 113b, such that after the conductive metal layer 114b having the circuit pattern is heated, the binder thereof is melted and bonded on the polymer film 110'. As indicated in FIGS. 3C and 3D, after the heat resistant releasing layer 112 is peeled off, the conductive metal layer 114' (that is, the conductive metal layer 114b) is patterned and fixed on polymer film 110' to form a conductive circuit 114' having a circuit pattern. It is noted that the conductive circuit 114' of FIG. 3D can be made by other manufacturing methods. For example, in the step as indicated in FIG. 3B, the conductive metal layer 114b can be hot pressed and fixed on the polymer film 110' by a laminating machine and the other steps can be substantially the same as the hot stamping process.

In the present embodiment, the heat resistant releasing layer 112 and the conductive metal layer 114b can be combined by an electrostatic absorption process or a release agent. Besides, the heat resistant releasing layer 112 can separate the stamping plate 113b from the conductive metal layer 114b to prevent the conductive metal layer 114b from being damaged by the stamping plate 113b during the hot stamping process. Thus, the conductive metal layer can be protected.

Figures 4A, 4B:
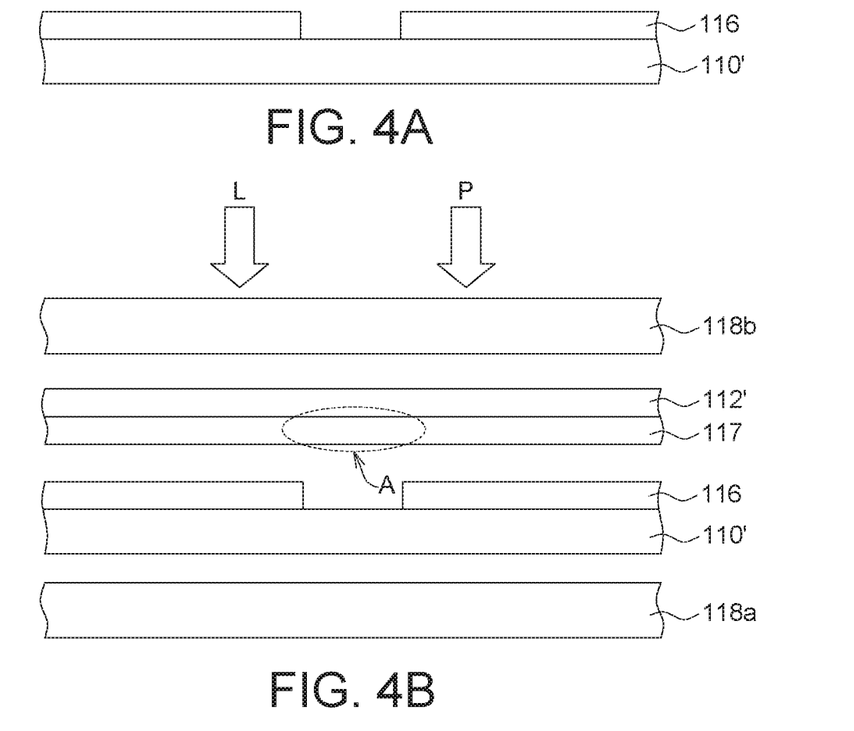
FIGS. 4A-4D are schematic diagrams of forming a conductive circuit by a cold stamping process according to a fourth embodiment of the present invention.
Figure 4C:
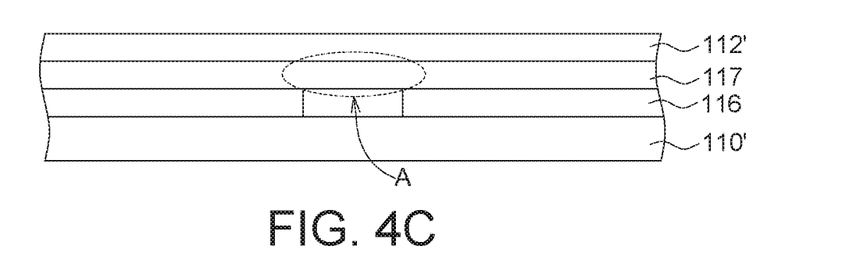
Figure 4D:
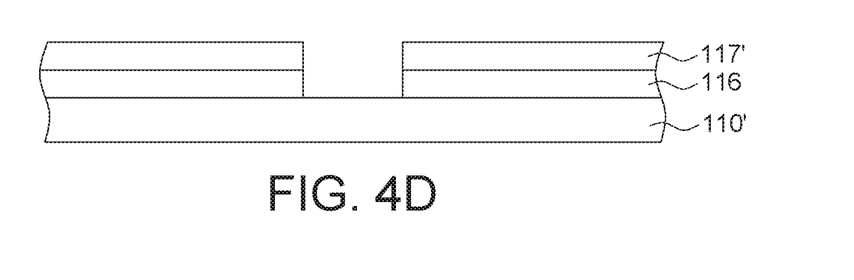

Refer to FIGS. 4A-4D. The method of forming a conductive circuit 117' by a cold stamping process according to a fourth embodiment of the present invention includes following steps. Firstly, as indicated in FIG. 4A, a binder (such as UV curing adhesive) is formed on the polymer film 110' in a printing or a bonding manner to form a patterned binder layer 116 having a circuit pattern. As indicated in FIG. 4B, a conductive metal layer 117 having a releasing layer 112', preferably a light resistant releasing layer, is disposed on the patterned binder layer 116, the conductive metal layer 117 is a metal foil, and the light resistant releasing layer 112' can be selectively disposed on the conductive metal layer 117, that is, the conductive metal layer 117 having the light resistant releasing layer 112' or without the light resistant releasing layer 112' can be placed on the patterned binder layer 116. Then, a pressure P is applied to the conductive metal layer 117 through the pressure plates 118a and 118b to press and fix a part of the conductive metal layer 117 onto the patterned binder layer 116 on the polymer film 110', and the patterned binder layer 116 is irradiated by a UV light (light L) and becomes cured. As indicated in FIG. 4C, another part of the conductive metal layer 117 attached onto the light resistant releasing layer 112' without being pressed and fixed (that is, area A) is peeled off due to a bonding force between the light resistant releasing layer 112' and the conductive metal layer 117. As indicated in FIG. 4D, after the light resistant releasing layer 112' is peeled off, the conductive metal layer 117 is patterned and fixed on the polymer film 110' having the patterned binder layer 116 to form a conductive circuit 117' having a circuit pattern. That is, the part of the conductive metal layer 117 not peeled off is patterned to form the conductive circuit 117' having a circuit pattern. It is noted that the conductive circuit 117' of FIG. 4D can be made by other manufacturing methods. For example, in the step as indicated in FIG. 4B, the conductive metal layer 117 can be pressed and fixed on the patterned binder layer 116 by other pressing and curing methods and the other steps can be substantially the same as the cold stamping process.

In the present embodiment, the light resistant releasing layer 112' and the conductive metal layer 117 can be combined by an electrostatic absorption process or a release agent. Besides, the light resistant releasing layer 112' can separate the pressure plate 118b and the conductive metal layer 117 to prevent the conductive metal layer 117 from being damaged by the pressure plate 118b during the cold stamping process. Thus, the conductive metal layer 117 can be protected. The light resistant releasing layer 112' is preferably formed of silicone, wax, light resistant resin or other light resistant material not easily deteriorated by the light. Besides, the light resistant releasing layer 112' can be formed of a soft material which can be recycled after use to save the material cost.

Figure 5A:
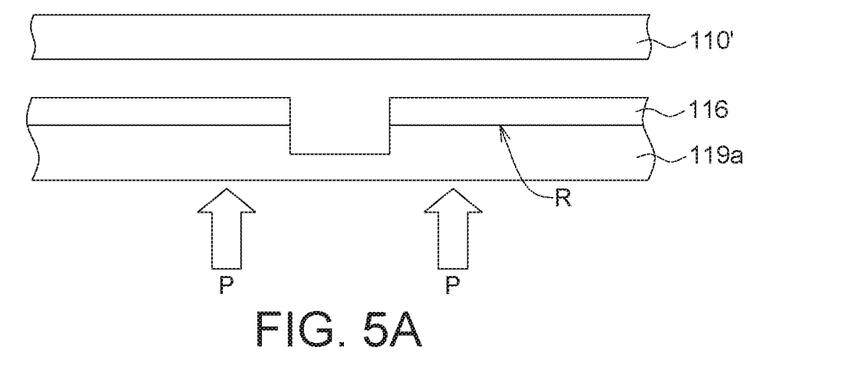
FIGS. 5A-5D are schematic diagrams of forming a conductive circuit by a cold stamping process according to a fifth embodiment of the present invention.
Figure 5B:
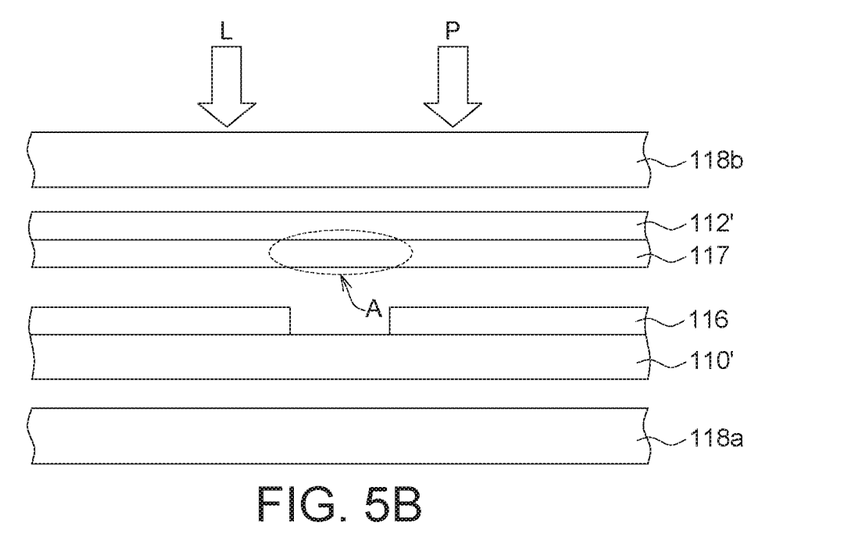
Figure 5C:
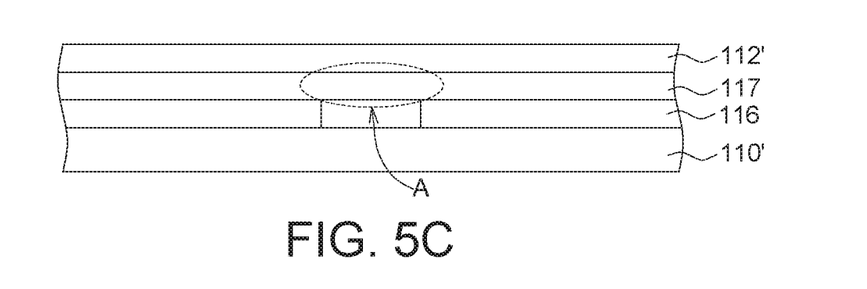
Figure 5D:
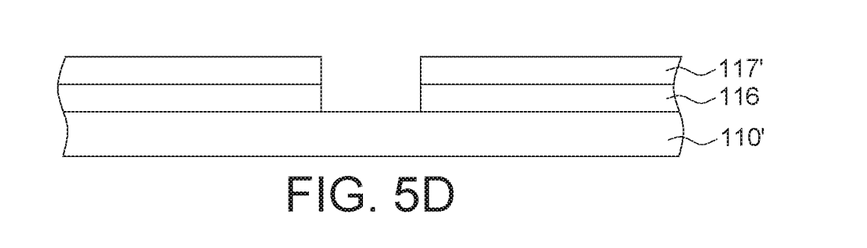

Refer to FIGS. 5A-5D. The method of forming a conductive circuit 117' by a cold stamping process according to a fifth embodiment of the present invention includes following steps. Firstly, as indicated in FIG. 5A, a binder (such as UV curing adhesive) is attached to the protrusion R of a toppan stamping plate 119a, and the protrusion R of the toppan stamping plate 119a forms a circuit pattern used for forming the pattern of a patterned binder layer 116, and then a polymer film 110' is placed on the patterned binder layer 116 and the patterned binder layer 116 is transfer-printed on the polymer film 110' using a pressure P. As indicated in FIG. 5B, a conductive metal layer 117 having a releasing layer 112', preferably a light resistant releasing layer, is disposed on the patterned binder layer 116, the conductive metal layer 117 is a metal foil, and the light resistant releasing layer 112' can be selectively disposed on the conductive metal layer 117, that is, the conductive metal layer 117 having the light resistant releasing layer 112' or without the light resistant releasing layer 112' is placed on the patterned binder layer 116, and a pressure P is applied to the conductive metal layer 117 through the pressure plates 118a and 118b to press and fix a part of the conductive metal layer 117 on the patterned binder layer 116, and the patterned binder layer 116 is irradiated by a UV light (light L) and becomes cured. As indicated in FIG. 5C, another part of the conductive metal layer 117 attached to the light resistant releasing layer 112' without being pressed and fixed (that is, area A) is peeled off due to a bonding force between the light resistant releasing layer 112' and the conductive metal layer 117. As indicated in FIG. 5D, after the light resistant releasing layer 112' is peeled off, the conductive metal layer 117 is patterned and fixed on the polymer film 110' having the patterned binder layer 116 to form a conductive circuit 117' having a circuit pattern. It is noted that the conductive circuit 117' of FIG. 5D can be made by other manufacturing methods. For example, in the step as indicated in FIG. 5B, the conductive metal layer 117 can be pressed and fixed on the patterned binder layer 116 by other pressing and curing methods and the other steps can be substantially the same as the cold stamping process.

Figure 6A:
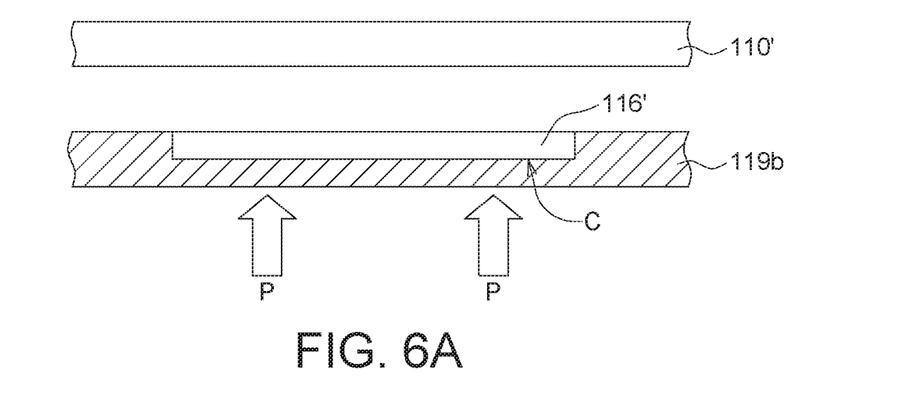
FIGS. 6A-6D are schematic diagrams of forming a conductive circuit by a cold stamping process according to a sixth embodiment of the present invention.
Figure 6B:
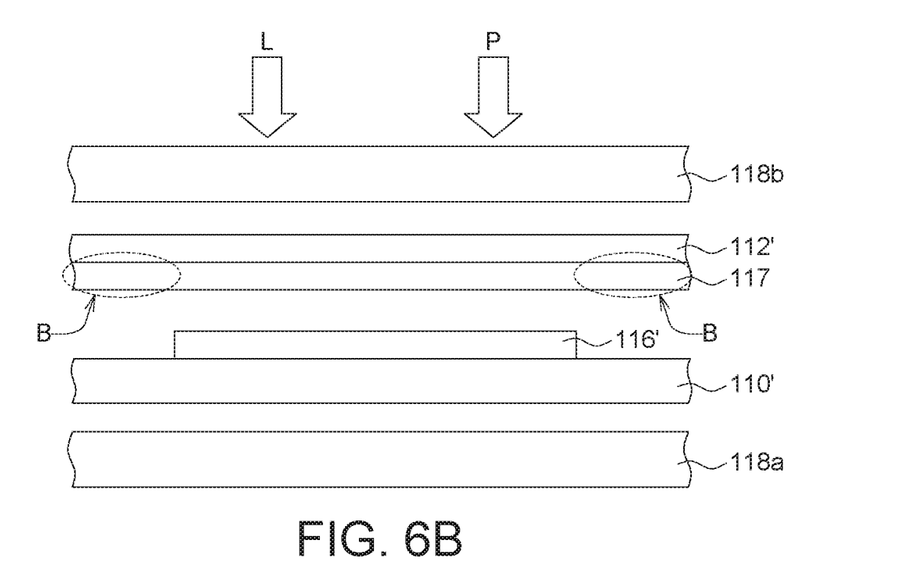
Figure 6C:
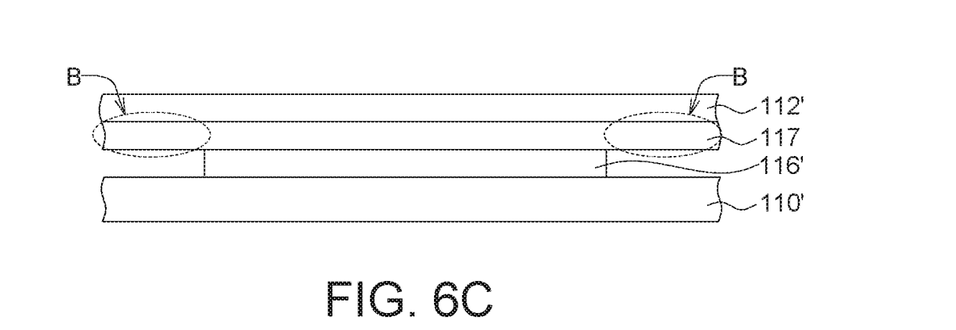
Figure 6D:
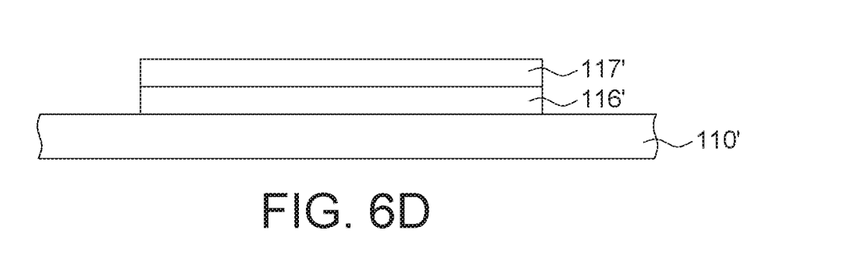

Refer to FIGS. 6A-6D. The method of forming a conductive circuit 117' by a cold stamping process according to a sixth embodiment of the present invention includes following steps. Firstly, as indicated in FIG. 6A, a binder (such as UV curing adhesive) is infused to a groove C of an intaglio plate 119b, and the groove C of the intaglio plate 119b forms a circuit pattern used for forming the pattern of the patterned binder layer 116', and a polymer film 110' is disposed on the patterned binder layer 116' and the patterned binder layer 116' is transfer-printed on the polymer film 110' using a pressure P. As indicated in FIG. 6B, a conductive metal layer 117 having a releasing layer 112', preferably a light resistant releasing layer, is disposed on the patterned binder layer 116', the conductive metal layer 117 is a metal foil, and the light resistant releasing layer 112' can be selectively disposed on the conductive metal layer 117, that is, the conductive metal layer 117 having the light resistant releasing layer 112' or without having the light resistant releasing layer 112' is placed on the patterned binder layer 116', and a pressure P is applied to the light resistant releasing layer 112' and the conductive metal layer 117 through the pressure plates 118a and 118b to press and fix a part of the conductive metal layer 117 on the patterned binder layer 116', and the patterned binder layer 116' is irradiated by a UV light (light L) and becomes cured. As indicated in FIG. 6C, another part of the conductive metal layer 117 attached to the light resistant releasing layer 112' without being pressed and fixed (that is, area B) is peeled off due to a bonding force between the light resistant releasing layer 112' and the conductive metal layer 117. As indicated in FIG. 6D, after the light resistant releasing layer 112' is peeled off, the conductive metal layer 117 is patterned and fixed on the polymer film 110' having the patterned binder layer 116' to form the conductive circuit 117' having a circuit pattern. It is noted that the conductive circuit 117' of FIG. 6D can be made by other manufacturing methods. For example, in the step as indicated in FIG. 6B, the conductive metal layer 117 can be pressed and fixed on the patterned binder layer 116' by other pressing and curing methods and the other steps can be substantially the same as the cold stamping process.

In the present embodiment, the light resistant releasing layer 112' and the conductive metal layer 117 can be combined by an electrostatic absorption process or a release agent. Besides, the light resistant releasing layer 112' can separate the pressure plate 118b from the conductive metal layer 117 to prevent the conductive metal layer 117 from being damaged by the pressure plate 118b during the cold stamping process. Thus, the conductive metal layer 117 can be protected.

Figure 7A:
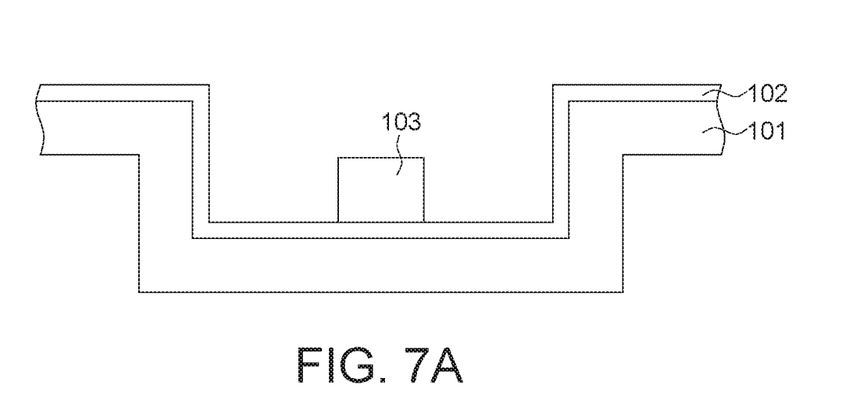
FIGS. 7A-7B are schematic diagrams of a manufacturing method of an electronic product according to an embodiment of the present invention.
Figure 7B:
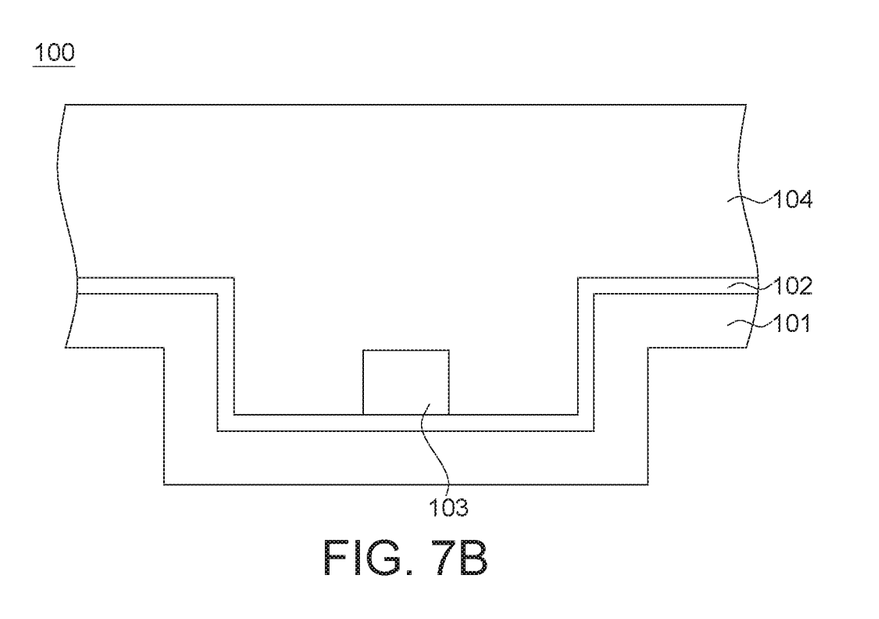

Refer to FIGS. 7A-7B. A manufacturing method of an electronic product 100 according to an embodiment of the present invention includes following steps. Firstly, as indicated in FIG. 7A, a conductive circuit 102 is formed on a film 101, and the conductive circuit 102 can be formed on the film 101 by a hot stamping process as indicated in FIGS. 1A-1D, FIGS. 2A-2D or FIGS. 3A-3D or by a cold stamping process as indicated in FIGS. 4A-4D, FIGS. 5A-5D or FIGS. 6A-6D, but the step of forming the conductive circuit 102 on the film 101 is not limited to the steps disclosed in above embodiments. It is noted that the conductive circuit 102 can be formed on the film 101 by other manufacturing methods of heating, pressing or curing in addition to the hot stamping or cold stamping processes illustrated in the above embodiments. Then, an electronic element 103 is formed on the conductive circuit 102 of the film 101, wherein the electronic element 103 can be electrically connected to the conductive circuit 102 for transmitting or receiving signals. The film 101 is a non-conductive film and can be a polymer film. The conductive circuit 102 can be formed by a material such as gold, silver, copper, iron, aluminum, nickel, zinc or an alloy thereof. In the present embodiment, the conductive circuit 102 can be made by a conductive metal layer being a metal foil having a thin thickness and incurring a low cost. In comparison to the conventional screen printing process which employs a conductive ink and incurs a high cost, the present invention can reduce the manufacturing cost and the processing time.

In the present embodiment, the film 101 can be a single-layer or a multi-film layer, and has both waterproof and dustproof functions to avoid the electronic element 103 and the conductive circuit 102 from being affected by moisture or dust. Moreover, in response to different needs, the film 101 can adaptively include at least one functional film such as a protective layer, a light-guiding layer, a decorative layer, a thermal layer, an electromagnetic mask layer, a chemical resistant layer, a waterproof layer, a support layer or an adhesive layer. The position of the functional film depends on actual needs, and detailed descriptions are disclosed below. The functional film can cover the electronic element 103 to prevent the electronic element 103 and the conductive circuit 102 from being subject to be hit by ejected plastics to become damaged.

Figure 9A:
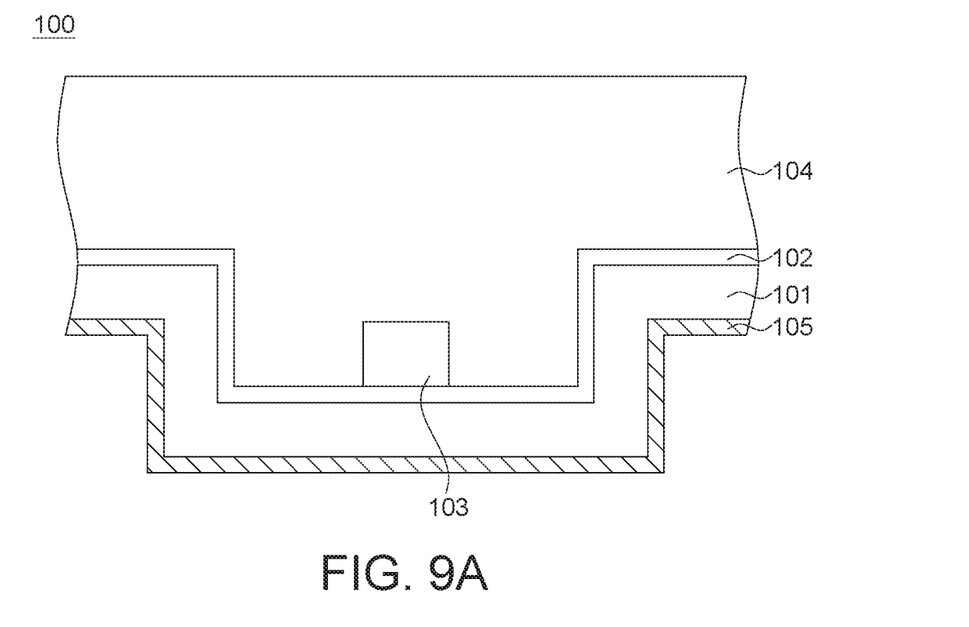
FIGS. 9A-9D are schematic diagrams of an electronic product having a functional film according to an embodiment of the present invention.
Figure 9B:
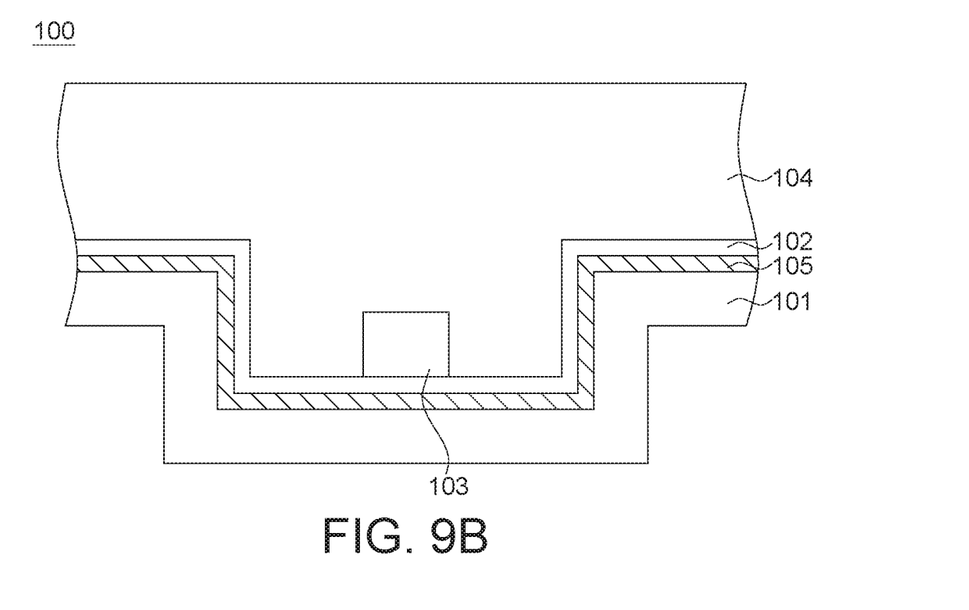
Figure 9C:
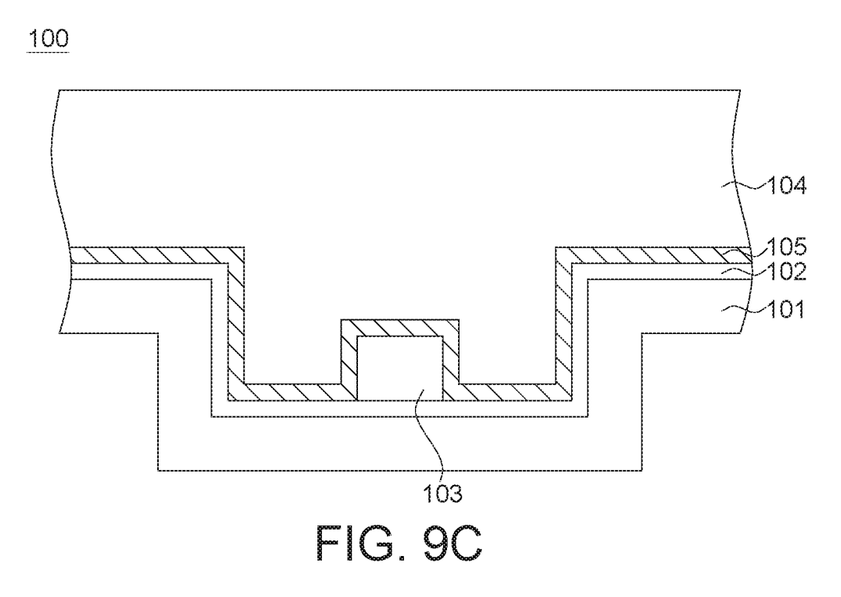
Figure 9D:
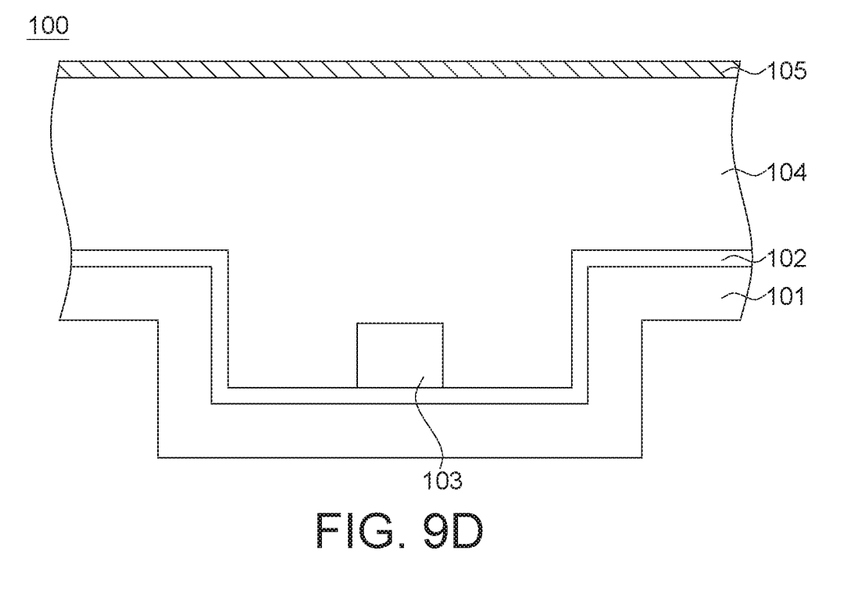

As indicated in FIG. 9A, the functional film 105 can be selectively formed on an outer surface of the film 101. As indicated in FIG. 9B, the functional film 105 can be interposed between the conductive circuit 102 and the film 101. As indicated in FIG. 9C, the functional film 105 can cover the electronic element 103 and the conductive circuit 102. As indicated in FIG. 9D, the functional film 105 can be disposed on an outer surface of the supporting structure 104, and the present invention does not have particular restrictions thereto.

As indicated in FIG. 7A, after a conductive circuit 102 and an electronic element 103a are formed on the film 101, a thermoforming process is performed to form the required shape; or, after the conductive circuit 102 is formed on the film 101, a thermoforming process is performed to form the required shape, and the electronic element 103 is then disposed on the conductive circuit 102. Subsequently, as indicated in FIG. 7B, the film 101 and a supporting structure 104 are combined by an in-mold forming technology, such that the electronic element 103 and the conductive circuit 102 are wrapped between the film 101 and the supporting structure 104 to form a waterproof and dustproof electronic product 100. The in-mold forming technology includes an injection molding method. Firstly, a film 101 having an electronic element 103 and a conductive circuit 102 is placed in a mold, and polymer plastics are heated to a melting state. Then, the polymer plastics are infused to the mold, and a supporting structure 104 required to make the electronic product 100 is formed after the polymer plastics cool and become cured. In the present embodiment, the supporting structure 104 or the film 101 can be used as an external view layer, and has waterproof, anti-shock (anti-collision and anti-drop) and dustproof functions. In response to actual needs, the external view layer can be a transparent layer or a non-transparent layer.

Figure 8A:
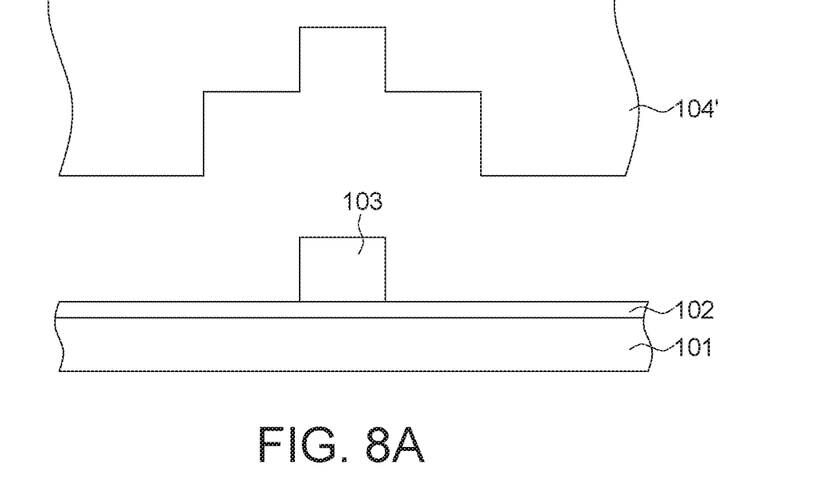
FIGS. 8A-8B are schematic diagrams of a manufacturing method of an electronic product according to another embodiment of the present invention.
Figure 8B:
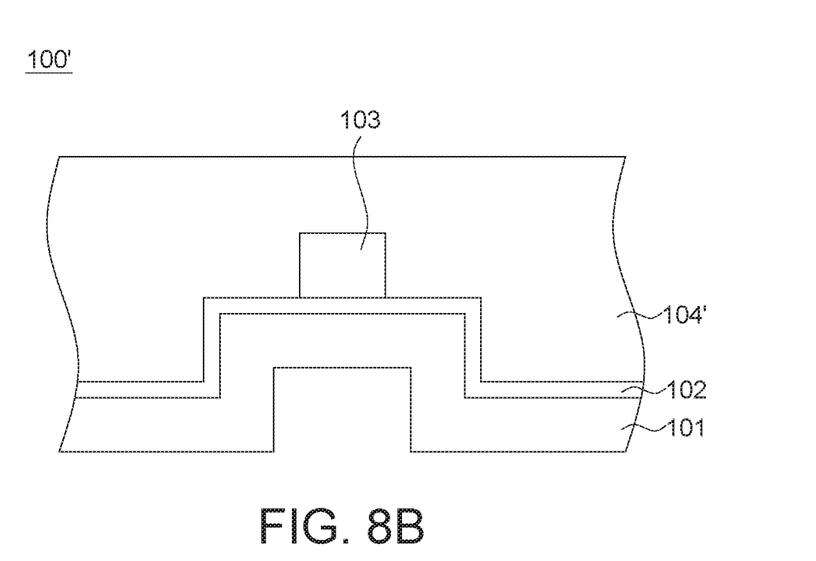

Referring to FIGS. 8A-8B, a manufacturing method of an electronic product 100' according to another embodiment of the present invention is shown. The present embodiment differs from the embodiments as indicated in FIGS. 7A-7B in that: after a conductive circuit 102 and an electronic element 103 are formed on the film 101, the film 101 and a supporting structure 104' are combined by an out-mold forming technology, such that the electronic element 103 and the conductive circuit 102 are wrapped between the film 101 and the supporting structure 104' to form a waterproof and dustproof electronic product 100'. The out-mold forming technology includes an out-mold wrapping method, a high temperature vacuum adsorption method, a hot pressing method, a ultrasonic melting method, a melt bonding method and an adhesive bonding method. In an embodiment, the film 101 can be a polymer film formed of thermoplastic plastics or thermosetting plastics. According to the out-mold wrapping method, the polymer film 101 is attached to the supporting structure 104' by a vacuum and positioning system at a specific temperature, and the polymer film 101 is tightly wrapped on the supporting structure 104' after the polymer film 101 is heated and becomes deformed. In an embodiment, the supporting structure 104' has a predetermined shape, and the polymer film 101 after being heated and deformed, is combined and superposed to the supporting structure 104' in a conformal manner to provide a tight wrapping effect. It is very difficult to remove the polymer film 101 from the supporting structure 104' using an external force.

According to the manufacturing method of an electronic product disclosed in above embodiments of the present invention, the conductive circuit is directly formed by a hot stamping process or a cold stamping process without using the stencil and expensive conductive ink, such that the manufacturing cost can be reduced. Besides, both the hot stamping process and the cold stamping process take a shorter processing time and require less working hours. Furthermore, the film and the supporting structure are combined by an in-mold forming technology or an out-mold forming technology to protect the electronic element and the conductive circuit. The supporting structure or the film can be used as an external view layer to provide the waterproof and dustproof functions and increase the reliability of the electronic product. The invention can be used in thinned electronic products with a human-machine interface. For example, the invention can be used in the control panel of consumer electronic products (such as microwaves, ovens, electric cookers, gas stoves, toasters, fridges, washing machines, dryers, showers, or toilets, audio equipment, notebook computers, remote controllers, keyboards and printers), and the control panel of vehicle parts (such as sunroof consoles, air conditioners and vehicle/motorbike dashboards). Besides, the present invention can be used in a supporting structure having a planar shape, a curved surface or a three-dimensional shape, and the material of the supporting structure is not limited to a single material or a composite material such as polymer, metal or ceramics. The supporting structure can be shaped by at least one of a casting process, a turning process, a stamping process and an extruding process, and formed by a ceramic powder injection molding process and a sintering process or formed by at least one of a plastics injection molding process, a film blasting and extruding process and a pultruding process.

While the invention has been described by way of example and in terms of the preferred embodiment(s), it is to be understood that the invention is not limited thereto. On the contrary, it is intended to cover various modification and similar arrangements and procedures, and the scope of the appended claims therefore should be accorded the broadest interpretation so as to encompass all such modification and similar arrangements and procedures.

What is claimed is:

1. A manufacturing method of an electronic product, comprising:
    forming a conductive circuit on a film by a hot stamping process, wherein the conductive circuit is made by a metal foil, a part of the metal foil is pressed and fixed to the film so as to pattern the metal foil as a conductive metal layer to form the conductive circuit, wherein a heat resistant releasing layer is disposed on the conductive metal layer and separates the conductive metal layer and a press plate, and a part of the metal foil not pressed and fixed to the film is removed by peeling off the heat resistant releasing layer;
    disposing an electronic element on the conductive circuit of the film, wherein the electronic element is electrically connected to the conductive circuit; and
    combining the film and a supporting structure by an out-mold molding technology or an in-mold molding technology, such that the electronic element is wrapped between the film and the supporting structure.

2. The manufacturing method according to claim 1, wherein the out-mold molding technology comprises an out-mold wrapping method, a high temperature vacuum adsorption method, a hot pressing method, a ultrasonic melting method, a melt bonding method or an adhesive bonding method, and the in-mold molding technology comprises an injection molding method.

3. The manufacturing method according to claim 1, wherein the film is a polymer film, and forming the conductive circuit comprises:
    forming a patterned ink layer having a circuit pattern on the polymer film;
    placing the conductive metal layer on the patterned ink layer; and
    hot pressing the conductive metal layer on the patterned ink layer.

4. The manufacturing method according to claim 3, further comprising disposing the conductive metal layer having the heat resistant releasing layer on the patterned ink layer.

5. The manufacturing method according to claim 1, wherein the film is a polymer film, and forming the conductive circuit comprises:
    placing the conductive metal layer on a toppan stamping plate, wherein a protrusion of the toppan stamping plate forms a circuit pattern, and the conductive metal layer contains a binder;
    placing the polymer film on the conductive metal layer; and
    hot pressing the conductive metal layer through the toppan stamping plate on the polymer film.

6. The manufacturing method according to claim 5, further comprising
    disposing the conductive metal layer having the heat resistant releasing layer on the toppan stamping plate.

7. The manufacturing method according to claim 1, wherein the film is a polymer film, and forming the conductive circuit comprises:

placing the conductive metal layer having a circuit pattern on the polymer film, wherein the conductive metal layer has a binder; and hot pressing the conductive metal layer on the polymer film.

8. A manufacturing method of an electronic product, comprising:

forming a conductive circuit on a film by a cold stamping process, wherein the conductive circuit is made by a metal foil, a part of the metal foil is pressed and fixed to the film so as to pattern the metal foil as a conductive metal layer to form the conductive circuit, wherein a light resistant releasing layer is disposed on the conductive metal layer and separates the conductive metal layer and a press plate, and a part of the metal foil not pressed and fixed to the film is removed by peeling off the light resistant releasing layer;

disposing an electronic element on the conductive circuit of the film, wherein the electronic element is electrically connected to the conductive circuit; and combining the film and a supporting structure by an out-mold molding technology or an in-mold molding technology, such that the electronic element is wrapped between the film and the supporting structure.

9. The manufacturing method according to claim 8, wherein the out-mold molding technology comprises an out-mold wrapping method, a high temperature vacuum adsorption method, a hot pressing method, a ultrasonic melting method, a melt bonding method or an adhesive bonding method, and the in-mold molding technology comprises an injection molding method.

10. The manufacturing method according to claim 8, wherein the film is a polymer film, and forming the conductive circuit comprises:

forming a patterned binder layer having a circuit pattern on the polymer film;

placing the conductive metal layer on the patterned binder layer; and applying a pressure to the conductive metal layer on the patterned binder layer, and curing the patterned binder to form a patterned conductive metal layer having the circuit pattern on the polymer film.

11. The manufacturing method according to claim 8, wherein the film is a polymer film, and forming the conductive circuit comprises:

forming a patterned binder layer on a protrusion of a toppan or a groove of an intaglio plate, wherein the protrusion of the toppan or the groove of the intaglio plate forms a circuit pattern;

placing the polymer film on the patterned binder and transfer-printing the patterned binder layer on the polymer film;

placing the conductive metal layer on the patterned binder layer; and applying a pressure to the conductive metal layer on the patterned binder layer, and curing the patterned binder layer to form a patterned conductive metal layer having the circuit pattern on the polymer film.

12. The manufacturing method according to claim 10, further comprising:

disposing the conductive metal layer having the light resistant releasing layer on the patterned binder layer.

13. The manufacturing method according to claim 11, further comprising:

disposing the conductive metal layer having the light resistant releasing layer on the patterned binder layer.

* * * * *